United States Patent [19]
Tam

[11] Patent Number: 5,955,908
[45] Date of Patent: Sep. 21, 1999

[54] FAST, LOW OUTPUT IMPEDANCE, LOW-IMPEDANCE, LOW-POWER CLAMP CIRCUIT FOR A SWITCHED COMPLEMENTARY EMITTER FOLLOWER

[75] Inventor: Kimo Y. F. Tam, Arlington, Mass.

[73] Assignee: Analog Devices, Inc., Norwood, Mass.

[21] Appl. No.: 08/804,131

[22] Filed: Feb. 20, 1997

[51] Int. Cl.[6] .................................................. H03K 5/08
[52] U.S. Cl. .......................... 327/315; 327/108; 327/321; 327/327
[58] Field of Search ........................... 327/108–112, 170, 327/309–332, 374–377, 379, 384, 391, 434, 437, 482–492; 330/288; 323/315–317

[56] References Cited

U.S. PATENT DOCUMENTS

| | | | |
|---|---|---|---|
| 4,485,352 | 11/1984 | Davies et al. | 330/288 |
| 4,533,845 | 8/1985 | Bynum et al. | 327/312 |
| 5,488,324 | 1/1996 | Mizuta et al. | 327/319 |
| 5,491,437 | 2/1996 | Rincon et al. | 327/309 |

OTHER PUBLICATIONS

"A 3 V CMOS Video Acquisition Channel," Katsu Nakamura et al., Analog Devices, Inc. and Sony Corporation, Presented at the Symposium on VLSI Circuits, Honolulu, HI, Jun. 1996, 2 pages.

*Primary Examiner*—Kenneth B. Wells
*Attorney, Agent, or Firm*—Wolf, Greenfield & Sacks, P.C.

[57] ABSTRACT

A fast, low output impedance, low-power clamp circuit for a switched complementary emitter follower includes a current mirror circuit and two transistors. In operation, high current is provided to allow for fast switching when turning off the complementary emitter follower. When the complementary emitter follower has been turned off, the clamp circuit reverts to low-power operation requiring much lower current while maintaining the complementary emitter follower in the off condition.

23 Claims, 6 Drawing Sheets

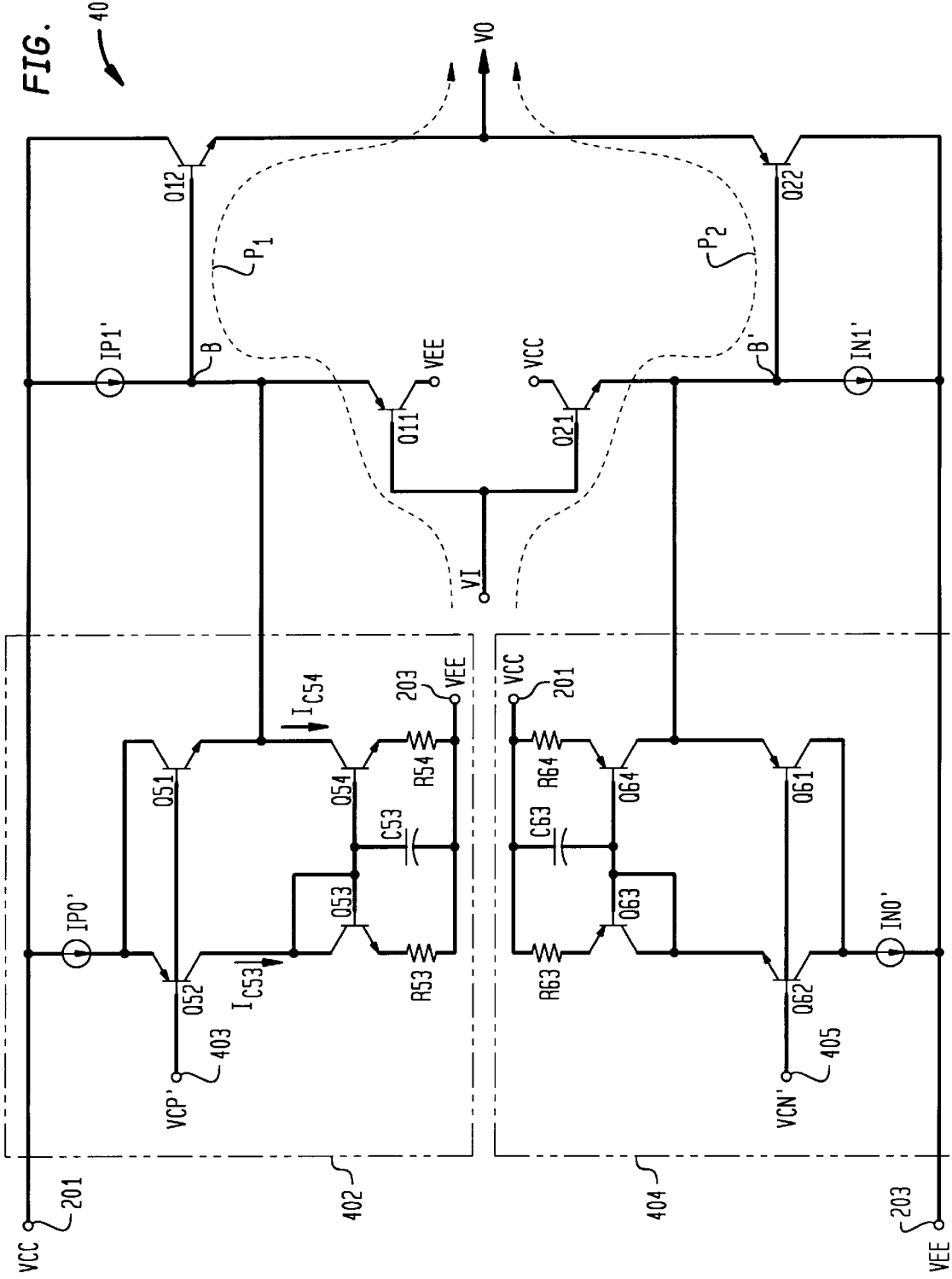

FAST, LOW OUTPUT IMPEDANCE, LOW-IMPEDANCE, LOW-POWER CLAMP CIRCUIT FOR A SWITCHED COMPLEMENTARY EMITTER FOLLOWER

BACKGROUND OF THE INVENTION

1. Field of the Invention

The present invention generally relates to clamp circuits and, more particularly, to a fast, low output impedance, low-power clamp circuit.

2. Discussion of the Related Art

Analog multiplexer circuits are used for distributing multiple analog signals to a single output, one at a time. As shown in FIG. 1, an analog multiplexer 100 includes N open-loop buffers $102_i$. Each buffer $102_i$ is a single input, single output, unity gain amplifier that either is enabled (to pass the input to the output) or disabled (to prevent the input from passing to the output). Each input lead 104$i$ carries one analog signal. An N:1 analog multiplexer can be constructed by connecting each input of buffer $102_i$ to a respective input lead 104$i$. The outputs of the N open-loop buffers $102_i$ are connected together as a shared output lead 106. In operation, only one of the buffers $102_i$ at a time is enabled and the corresponding input 104$i$ connected thereto controls a voltage potential of the shared output lead 106, while the other buffers $102_i$ remain disabled. Ideally, it is desired that the one enabled buffer would have a gain A of one (1) while the disabled buffers each have a gain of zero (0).

A conventional complementary emitter follower 200, as shown in FIG. 2, can be modified to serve as a switchable open-loop buffer $102_i$ in multiplexer 100. Complementary emitter follower 200 includes PNP transistors Q11, Q22, NPN transistors Q12, Q21, current sources IP1, IN1, first supply line 201, second supply line 203, input lead 104$i$ and output lead 202.

Complementary emitter follower 200 receives an analog input signal voltage VI at an input lead 104$i$ and outputs an analog output signal voltage VO on output lead 202 substantially equal to the input signal voltage VI.

As shown in FIG. 2, the base of transistor Q11 is coupled to input lead 104$i$ and the collector is coupled to the second supply line 203. The base of transistor Q21 also is coupled to input lead 104$i$ and the collector is coupled to the first supply line 201. Current source IP1 is coupled between the first supply line 201 and the emitter of transistor Q11. The base of NPN transistor Q12 is coupled to the emitter of PNP transistor Q11, the collector is connected to the first supply line 201 and the emitter is connected to output lead 202. The emitter of PNP transistor Q22 is coupled to the output terminal 202 and the collector is coupled to the second supply line 203. Current source IN1 is coupled between the second supply line 203 and the emitter of the NPN transistor Q21. The first supply line 201 receives supply voltage $V_{CC}$ and the second supply line receives supply voltage $V_{EE}$.

To enable the follower 200, current sources IP1 and IN1 are turned on, each providing an emitter current to transistors Q11 and Q21, respectively. These transistors, in turn, forward bias transistors Q12 and Q22, respectively, which completes the complementary signal path from the input lead 104$i$ of the follower 200, receiving input signal voltage VI, to the output lead 202 providing output signal voltage VO.

To disable the follower 200, the current sources IP1 and IN1 are turned off, which eliminates the emitter currents of transistors Q11 and Q21. This leaves the collector currents of all four devices, i.e., transistors Q11, Q12, Q21 and Q22, at almost zero and the base nodes of transistors Q12 and Q22 as DC open circuits.

In this off state, i.e., disabled state, the input lead 104$i$ and output lead 202 of the follower 200 are isolated from one another by two parallel paths $P_1$, $P_2$; the first path $P_1$ including transistors Q11 and Q12 and the second path $P_2$ including transistors Q21 and Q22. Each of these paths $P_1$, $P_2$ includes back-to-back, zero-biased emitter-base junctions. Using first path $P_1$ as an example, if the transistors all have equal junction capacitances and the external source impedance is low, then the small-signal off transmission value $A_1$, i.e., the reciprocal of the isolation value, of first path $P_1$ is characterized by a single time constant $\tau$ and is given by:

$$A_1(s) = \frac{v_o}{v_i} = \frac{2\tau s}{\tau s + 1} \approx 2\tau s \text{ for } \tau s \ll 1 \quad (1)$$

$$\tau = R_L \left( \frac{C_{je11} C_{je12}}{C_{je11} + C_{je12}} \right) \quad (2)$$

where $s = j\omega$ is the Laplace transform variable, $R_L$ is the load resistance, and $C_{je11}$ and $C_{je12}$ are the emitter-base capacitances of transistors Q11 and Q12, respectively. In other words, the gain $A_1$ is proportional to frequency and it is desirable, therefore, to make $\tau$ small.

In many applications, however, the isolation afforded by simply opening the bases of the output transistors Q12 and Q22, as in FIG. 2, is inadequate. The "off-isolation" of the follower 200 can be improved by clamping each of the bases of the output transistors Q12 and Q22 with a low impedance source when the follower 200 is disabled.

As shown in FIG. 3, a conventional complementary emitter follower 200' is provided with conventional base clamp circuits 302, 304. The clamped complementary emitter follower 200' has the same structure as the follower 200 shown in FIG. 2, except for the addition of the two clamp circuits, 302, 304. All similarly labeled elements function as described above with regard to FIG. 2.

Inserted into the first path $P_1$ of the clamped follower 200', clamp circuit 302 includes clamping NPN transistor Q10, current source IP0 and first bias supply lead 303. Clamp circuit 304 inserted into the second path P2, includes clamping PNP transistor Q20, current source IN0 and second bias supply lead 305. The collector of clamping NPN transistor Q10 is coupled to the first supply line 201 and its emitter is coupled to the base of the NPN transistor Q12. The base of clamping transistor Q10 is coupled to the first bias supply lead 303. The current source IP0 is coupled between a supply lead $V_{EE}$ and the emitter of clamp transistor Q10. Node A represents a junction of the emitter of clamp transistor Q10, i.e., the output of clamp circuit 302, and the base of NPN transistor Q12. The first bias supply lead 303 receives bias voltage VCP.

In clamp circuit 304, the collector of clamping PNP transistor Q20 is coupled to the second supply line 203, its base is coupled to the second bias supply lead 305 and its emitter is coupled to the base of the PNP transistor Q22. The second current source IN0 is coupled between a supply lead $V_{CC}$ and the emitter of transistor Q20. Node A' represents a junction of the emitter of the clamping transistor Q20, i.e., the output of the clamp circuit 304, and the base of the PNP transistor Q22. The second bias supply lead 305 receives bias voltage VCN.

When the clamped follower 200' is enabled, as per the description above with regard to follower 200, current sources IP0 and IN0 are turned off. Bias voltages VCP and VCN, respectively, are set to values which bias transistors Q10 and Q20 in cutoff. As a result, the operation of the clamped follower 200' is similar to that of the unclamped follower 200 shown in FIG. 2. In other words, the output signal voltage VO at output lead 202 follows the input signal voltage VI at input lead 104i.

When the clamped follower 200' is disabled, current sources IP1 and IN1 are turned off and current sources IP0 and IN0 are turned on. Transistors Q10 and Q20 are, therefore, forward biased which turns off transistors Q12 and Q22. The "off isolation" of the clamped follower 200' is equivalent to that of two open T-switches in parallel; the first T-switch consisting of transistors Q11, Q10 and Q12 and the second T-switch consisting of transistors Q21, Q20 and Q22. As can be seen, each T-switch consists of back-to-back reverse-biased emitter-base junctions, a common node of each of which is driven by a low impedance source.

A small-signal model for the first T-switch, i.e., first path P, and clamp circuit 302, of the emitter follower 200' is shown in FIG. 4. The small-signal model includes two capacitors $C_{je11}$, $C_{je12}$ and two resistors $R_{CLAMP}$, $R_L$. In the model, as per the discussion of Equation 2 above, the capacitors $C_{je11}$ and $C_{je12}$ represent the emitter-base capacitances of transistors Q11 and Q12, respectively. The resistance $R_{CLAMP}$ represents the impedance of the clamp circuit 302 and resistance $R_L$ represents the load resistance. In the small-signal model, the goal is to have $R_{CLAMP}$ be as small as possible so as to get a best possible "off isolation."

Representing the current from each of current sources IP0 and IN0 as I0 and assuming that the transistors all have equal junction capacitances, the approximate low-frequency transmission, or gain, $A_2$ of the first path $P_1$ of the clamped follower 200' is given by a ratio of $V_0$ to $V_i$:

$$A_2(s) = \frac{v_o}{v_i} \approx 2\tau_1\tau_2 s^2 \text{ for } \tau_1 s, \tau_2 s \ll 1 \quad (3)$$

$$\tau_1 R_{CLAMP} C_{je11} \quad (4)$$

$$\tau_2 = R_L C_{je12} \quad (5)$$

where $R_{CLAMP}$ is the output resistance of the clamp circuit and $R_L$ is the load resistance and, as above, s=jω. In Equation 3, the gain $A_2$ varies as the square of the frequency.

The output resistance $R_{CLAMP}$ is given as follows:

$$R_{CLAMP} = \frac{kT}{qI_o} \quad (6)$$

where k is Boltzmann's constant, T is the absolute temperature in degrees Kelvin, q is the electron charge, and $I_o$ is the quiescent output current. At room temperature, i.e., 27° C. (300° K.), the value of (kT/q) is approximately 25.85 millivolts.

As can be seen, if the transistors Q10 and Q20 have low base resistances and are driven by low impedance sources, then the isolation of the clamped complementary emitter follower 200' is proportional to the current I0. Since the currents provided by current sources IP0 and IN0 are also the slew currents for the bases of transistors Q12 and Q22, respectively, the switching time of the follower 200' is inversely proportional to current I0. Therefore, to provide faster switching time, more current is required. However, this means larger power consumption for the device since the current will be necessary whether the follower 200' is disabled or enabled. Thus, there is a conflict between the need for faster switching speed versus the requirements of lower power consumption and the compromises between them which must be made.

It therefore is a general object of the present invention to provide a clamp circuit which provides relatively high speed switching and also has low power consumption.

SUMMARY OF THE INVENTION

A fast, low-power clamp circuit according to the present invention provides a clamp circuit having short switching time and low "on" impedance with low power consumption. This clamp circuit uses a current source connected to two transistors connected to a current mirror circuit.

One embodiment of the present invention is directed to a clamp circuit for isolating an output transistor from an input transistor, comprising a bias voltage lead, a first clamp transistor having a base, a collector and an emitter, the emitter connected to the bias voltage lead, and a second clamp transistor having an emitter connected to the output transistor and the input transistor, a base connected to the base of the first clamp transistor and a collector connected to the emitter of the first clamp transistor. A current mirror circuit having an input and an output, the input connected to the collector of the first clamp transistor and the output connected to the emitter of the second clamp transistor is also provided.

A next embodiment is directed to a clamp circuit including a first clamp transistor having a base, a collector and an emitter; a first mirror transistor having a base and a collector connected to one another; and a first mirror resistor having first and second terminals, the first terminal connected to an emitter of the first mirror transistor. A clamp capacitor having first and second terminals, the first terminal connected to the base of the first mirror transistor and the second terminal connected to the second terminal of the first mirror resistor and a second mirror transistor connected to the base of the first mirror transistor are provided. A second mirror resistor having first and second terminals, the first terminal connected to the emitter of the second mirror transistor and the second terminal connected to the second terminal of the clamp capacitor; and a second clamp transistor having an emitter connected to the collector of the second mirror transistor, a base connected to the base of the first clamp transistor and a collector connected to the emitter of the first clamp transistor are included.

A next embodiment is directed to a method of clamping a node at a predetermined voltage level, the method comprising the steps of providing a current at a first current level to the node until a voltage at the node reaches the predetermined voltage level; and providing a current at a second current level to the node when the voltage at the node has reached the predetermined voltage level.

BRIEF DESCRIPTION OF THE DRAWINGS

These and other advantages of the present invention will be readily appreciated as the same becomes better understood by reference to the accompanying drawings, in which like reference numerals designate like or corresponding parts throughout, wherein:

FIG. 5 is a schematic diagram of an embodiment of a clamped follower according to the present invention;

DETAILED DESCRIPTION

Figure 1:
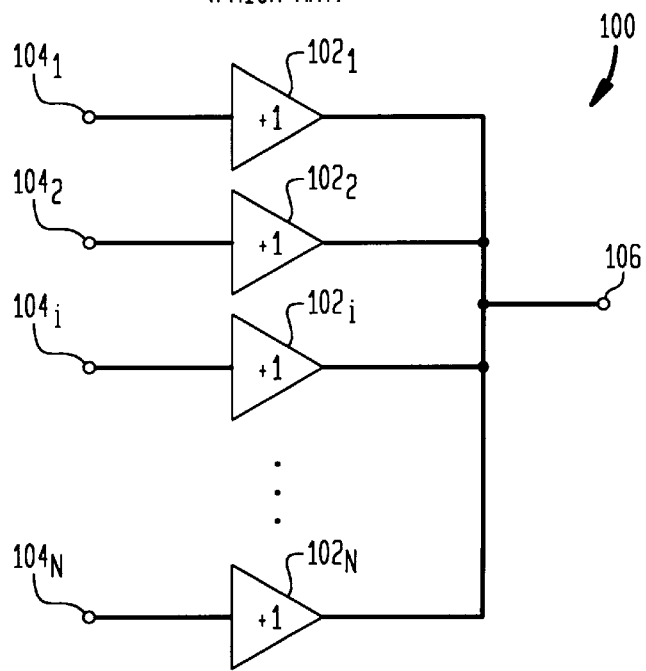
FIG. 1 is a block diagram of a conventional video signal multiplexer.
Figure 2:
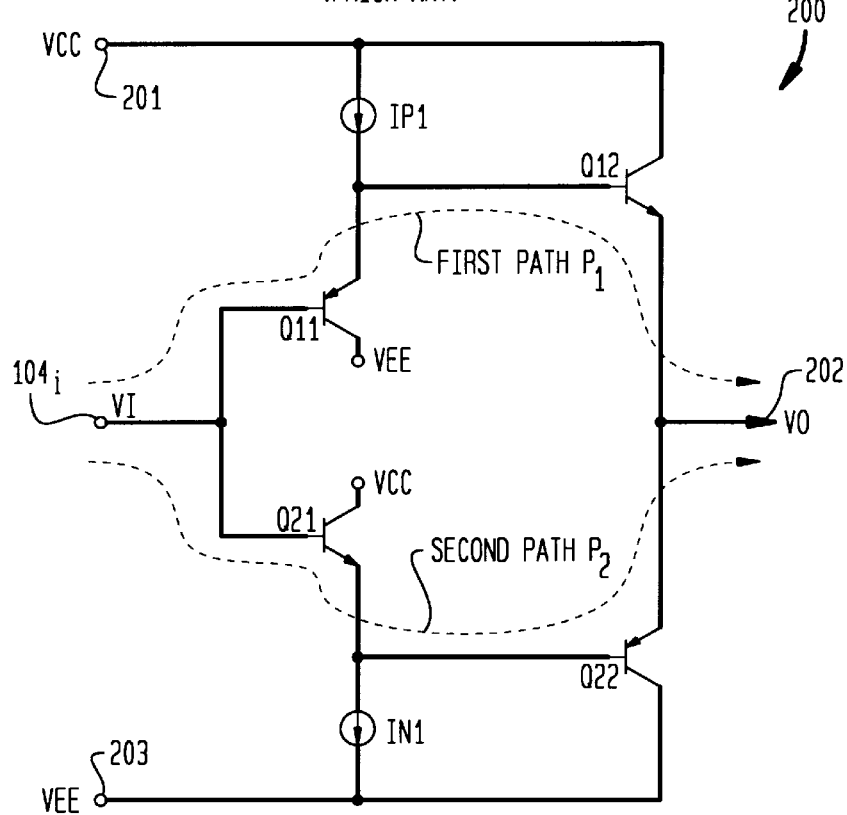
FIG. 2 is a schematic diagram of a conventional complementary emitter follower buffer.

The complementary emitter follower 400 of the present invention, is shown in FIG. 5. Transistors Q11, Q12, Q21, Q22 and current sources IP1' and IN1' function as already described.

Two clamp circuits 402, 404 provided, respectively, for each "side" or "path" P1, P2 of the complementary emitter follower 400 are shown in FIG. 5. The first clamp circuit 402 includes current source IP0', NPN clamp transistor Q51, PNP clamp transistor Q52, NPN mirror transistors Q53, Q54, resistors R53, R54, capacitor C53 and bias supply lead 403. The second clamp circuit 404 includes current source IN0', PNP clamp transistor Q61, NPN clamp transistor Q62, PNP mirror transistors Q63, Q64, resistors R63, R64, capacitor C63 and bias supply lead 405.

Since the two clamp circuits 402, 404 are complementary and operate similarly to each other, for simplicity, only clamp circuit 402 will be described below. The operation of clamp circuit 404 can be understood from the following description with proper reversal of polarities of the supplies and transistors.

The base of PNP clamp transistor Q52 is connected to bias voltage lead 403. The base of NPN clamp transistor Q51 is connected to the base of PNP clamp transistor Q52 and the collector is connected to the emitter of the PNP clamp transistor Q52. Current source IP0' is coupled between first supply line 201 and the emitter of clamp NPN transistor Q53. Bias voltage lead 413 receives a bias voltage VCP' to set the clamp level at the emitter of Q51. As an example, if one wanted a clamp voltage of 1.0 volts, VCP' would be set to $(1+V_{BE})$ where $V_{BE}$ is the base-emitter voltage of Q51.

An M:1 current mirror circuit is formed by the coupling of the base of NPN mirror transistor Q53 to the base of NPN mirror transistor Q54. The designation "M:1" indicates that an output current in the collector of transistor Q54 of the mirror circuit is M times greater than an input current in the collector of transistor Q53. The base of NPN mirror transistor Q53 is coupled to its collector and to the collector of PNP clamp transistor Q52. Resistor R53 has one terminal connected to the emitter of NPN mirror transistor Q53 and a second terminal operatively coupled to the second supply line 203. Resistor R54 has a first terminal connected to the emitter of NPN mirror transistor Q54 and a second terminal is connected to the second supply line 203. Capacitor C53 is connected between the base of NPN mirror transistor Q54 and the second supply line 203. The collector of NPN mirror transistor Q54 is connected to the emitter of NPN clamp transistor Q51 and to the base of transistor Q12 at node B.

The addition, as shown in FIG. 5, of clamp circuits 402, 404 to the complementary emitter follower 200, results in a follower 400, according to the present invention, with improved isolation and faster switching time due to the low output impedance of the clamp circuits 402, 404 and higher transient output current for a given quiescent clamp current. It can be expected that the impedance level will be approximately M+1 times lower than the simple circuit of FIG. 3, with the switching time being approximately M+1 times faster.

When follower 400 is enabled, current sources IP0' and IN0' are turned "off" and the current sources IP1' and IN1' are turned on. All "off" current sources, rather than being turned completely off, actually still provide current at a rate which is approximately 1% of the full "on" value so as to decrease time needed to come to the full "on" condition.

When follower 400 is disabled, current sources IP1' and IN1' are turned "off" and current sources IP0' and IN0' are turned on. The input voltages, $V_{EE}$, $V_{CC}$, and bias voltages VCP', VCN' are applied whether the follower is disabled or enabled. Operation of the clamp circuit 402 will now be described.

Initially, the output voltage of clamp circuit 402 at node B will be at a higher voltage potential than the bias voltage VCP' so that NPN clamp transistor Q51 will be reverse biased. Since NPN clamp transistor Q51 effectively is off, the collector current from the current source IP0' will flow through PNP clamp transistor Q52 into the input side of the current mirror circuit, i.e., the collector of NPN mirror transistor Q53.

The current mirror circuit can be designed in several ways to affect the M:1 ratio (the current gain of the mirror), e.g., by varying the emitter area ratios of transistors Q53, Q54 and/or varying the resistor ratio R53:R54. A degeneration factor, represented by a ratio of $$(I_{53} \times R_{53}):(kT/q) \qquad (7)$$

where $I_{53}$ is the current through resistor $R_{53}$, $(I_{53} \times R_{53})$ being the voltage drop across resistor $R_{53}$, and $(kT/q)$ being approximately 25.85 mV, as discussed above, can be calculated. The degeneration factor of the mirror can be tailored to change the output current characteristics of the mirror and, therefore, the clamp circuit 402. When the degeneration factor is high, i.e., much greater than 1, the current gain is dominated by the resistor ratio. When the degeneration factor is much less than 1, the current gain is dominated by the ratio of the emitter areas of Q53 and Q54. In practice, it is preferred to make transistor Q54 as small as possible so as to minimize its collector-base capacitance, which diminishes current from the collector of transistor Q53 while the output is stewing. The resistors R53, R54 offer a degree of freedom by providing an ability to increase a transient current gain $M_T$ without having to proportionally increase the emitter area of transistor Q54. In this case, the initial mirror circuit degeneration is high so that the transient current gain $M_T$ is nearly equal to the resistor ratio R53:R54 as shown below in Equation (8):

$$M_T = \left. \frac{I_{c54}}{I_{c53}} \right|_{Q51 \, off} \sim \frac{R_{53}}{R_{54}} \qquad (8)$$

As shown in Equation 8, when transistor Q51 is off, the transient current gain $M_T$ is equal to the ratio of the collector current $I_{c54}$ in transistor Q54 to the collector current $I_{c53}$ in transistor Q53. This ratio is then proportional to the ratio of resistor R53 to resistor R54.

If, for example, it is assumed that resistor R53 has a value of 5K ohms and resistor R54 has a value of 1K ohms and the current provided by current source IP0' is approximately 50 µA, then the initial output current of the current mirror circuit and, therefore, the clamp circuit 402, is approximately 250 µA (5K/1K*50 µA). This output current pulls down the voltage at output node B until it is equal to approximately one $V_{BE}$ voltage drop below the bias voltage VCP'. At that point, i.e., when voltage at output mode A is VCP'-$V_{BE}$, NPN clamp transistor Q51 turns on and "draws" current from the emitter of PNP clamp transistor Q52. Conservation of current output by current source IP0' requires that a total of the collector current in transistor Q51 and an emitter current in transistor Q52 be substantially equal to the current provided by current source IP0'. Since output node B of clamp circuit 402 is no longer slowing and its DC output current is small, due only to the trickle current left in current source IP1', the total of transistors' Q53 and Q54 collector currents must also be approximately equal to the current from current source IP0', assuming a high β value of about 100, i.e., the ratio of the collector current to the base current of the transistor.

A determination of the partitioning of quiescent currents in the mirror circuit must be solved iteratively, but the mirror is running at a lower degeneration factor when most of the current from current source IP0' flows through NPN mirror transistor Q54 rather than NPN mirror transistor Q53. As a coarse approximation, therefore, the quiescent current gain $M_Q$ under these quiescent conditions is equal to:

$$M_Q = \left.\frac{I_{c54}}{I_{c53}}\right|_{Q_{51}on} \sim \frac{AE_{54}}{AE_{53}} \quad (9)$$

where $I_{c54}$ and $I_{c53}$ are the quiescent collector currents in transistors Q54 and Q53, respectively, and $AE_{54}$ and $AE_{53}$ are the respective emitter areas of transistors Q54 and Q53. As shown in Equation 9, when transistor Q51 has turned on, the quiescent current gain is proportional to the ratio of the emitter areas of transistors Q54 and Q53. This transition occurs because, when transistor Q51 has turned on, the current from current source IP0' is divided between transistors Q52 and Q51.

Since a sum of the collector current in transistor Q54 and the collector current in transistor Q53 is approximately 50 µA, i.e., the amount of current provided by current source IP0', the collector currents are distributed between transistors Q53, Q54 such that approximately 34 µA flows in the collector of NPN transistor Q54 and approximately 16 µA flows in the collector of NPN transistor Q53. As desired, the total quiescent current of the clamp is 50 µA which is much lower than the peak current of 250 µA, as above.

The incremental collector current of NPN clamp transistor Q51 is related to the incremental output voltage of the clamp circuit 402 by the transconductance of NPN clamp transistor Q51. This incremental current is passed to NPN mirror transistor Q53 by PNP clamp transistor Q52 and amplified by the current mirror circuit whose output current sums with the incremental emitter current of NPN clamp transistor Q51. Thus, the output impedance $R_{CLAMPA}$ of the clamp circuit 402, ignoring base resistance and the impedance of the source of bias voltage VCP', is equal to:

$$R_{CLAMPB} = \frac{kT}{qI_{c50}} \frac{1}{1+M_Q} \quad (10)$$

where k, T, q have been defined previously and $I_{c50}$ is the quiescent collector current of transistor Q50.

The capacitor C53 works against the sum of resistor R53 and the emitter resistance of NPN mirror transistor Q53 to limit the bandwidth of the clamp feedback loop and prevent undesirable oscillation. The values of the resistor R53 and capacitor C53 control the bandwidth of the system. The bandwidth is approximately $1/(2\pi R_{53}C_{53})$. The loop consists of transistors Q54, Q51 and Q52. As a result, at high frequencies, the capacitor C53 appears as a short to stop any oscillation in the loop which might occur. Depending upon the desired application, the capacitor C53 can also be left out of the circuit.

It should be noted that the resistors R53 and R54 can be replaced with short circuits and the current mirror will also function as intended. The transient current ratio $M_T$ would then be proportional to the emitter area ratio as shown in Equation 9 above.

Figure 5A:
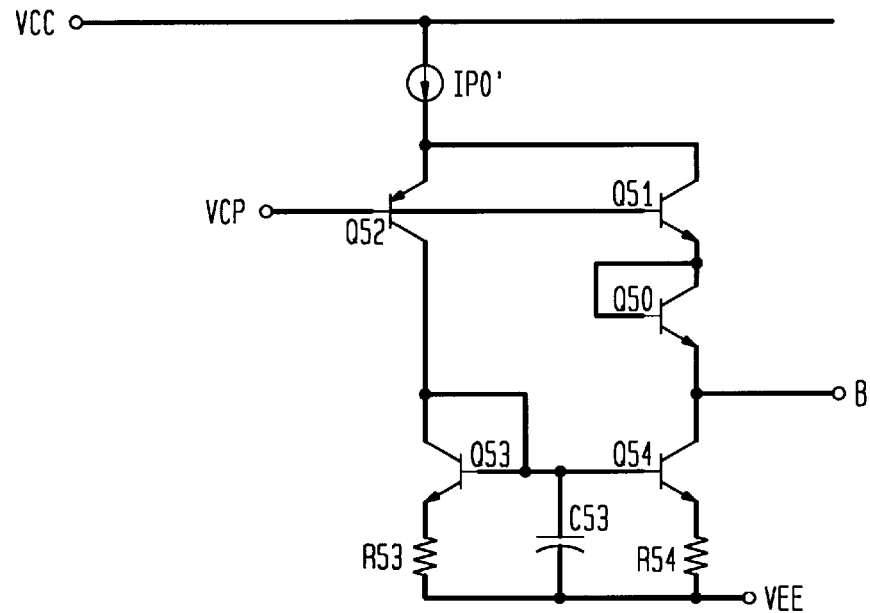
FIG. 5A is a schematic diagram of an alternative embodiment of a clamped circuit according to the present invention.

In another embodiment of the clamp circuit 402, as shown in FIG. 5A, a transistor Q50, configured as a diode, is connected between the emitter of NPN clamp transistor Q51 and the collector of NPN mirror transistor Q54. The collector of transistor Q50 is connected to the emitter of NPN clamp transistor Q51 and the emitter of transistor Q50 is connected to the collector of NPN mirror transistor Q54 with the base of transistor Q50 coupled to its collector. Transistor Q50 limits the reverse bias voltage across the emitter-base junction of NPN clamp transistor Q51 and thus prevents breakdown.

In operation, the addition of the transistor Q50 will cause the output current of the clamp circuit 402 to pull down the voltage of node B, i.e., the base of transistor Q12, until it is approximately at a voltage $2*V_{BE}$ below the bias voltage VCP'. The incremental collector current of NPN clamp transistor Q51 would then be related to the incremental output voltage of the clamp circuit 402 by the transconductance of the series connection of transistors Q50 and Q51. The operation of the clamp circuit 402 with the transistor Q50 in place would otherwise be the same as above described with regard to the embodiment described in FIG. 5 except that the output impedance $R_{CLAMPA}$ of the clamp circuit 402, ignoring base resistance and the impedance of the source of bias voltage VCP', is equal to:

$$R_{CLAMPB} = 2\frac{kT}{qI_{c50}} \frac{1}{1+M_Q} \quad (11)$$

The factor of two (2) accounts for the two series junctions of transistors Q50 and Q51.

Figure 6A:
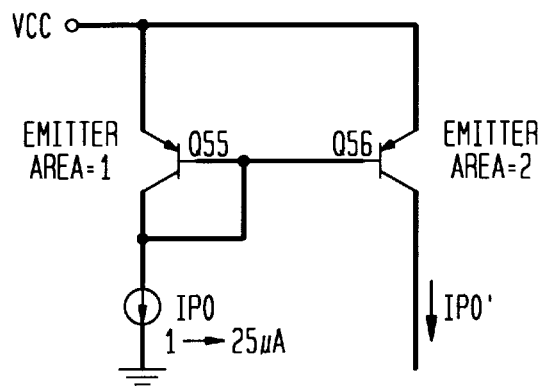
FIGS. 6A–6D are schematic diagrams of current sources IP0', IP1', IN0', IN1' as shown in FIG. 5.
Figure 6B:
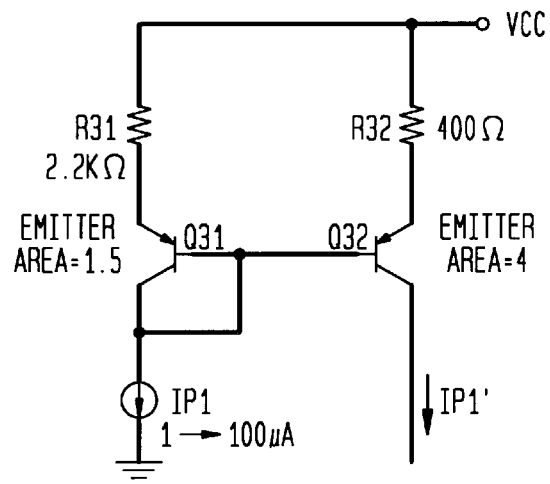
Figure 6C:
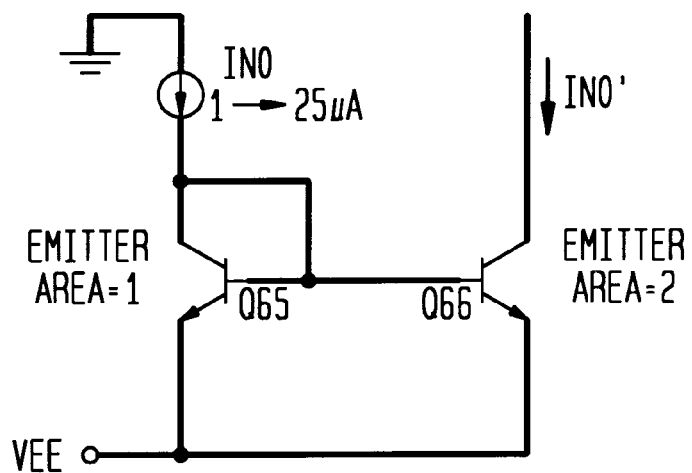
Figure 6D:
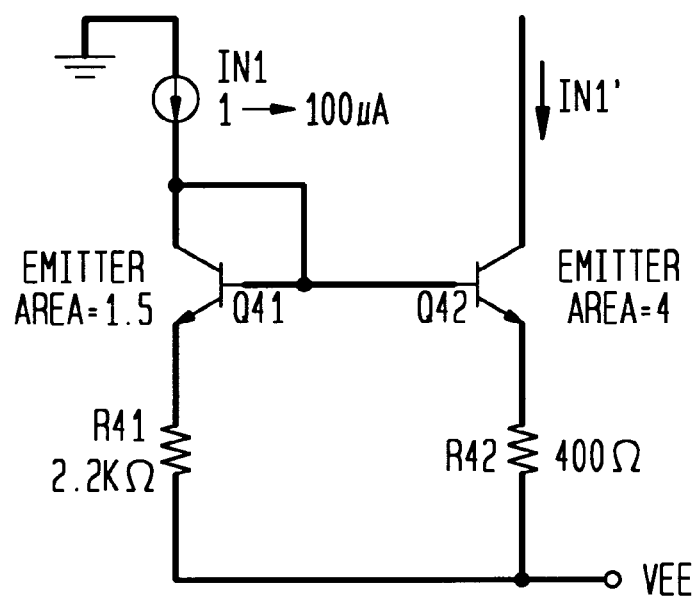

As shown in FIGS. 6A–6D, each of current sources IP0', IP1', IN0' and IN1' can be made from current mirror circuits including transistors and resistors. As shown in FIG. 6A, for example, current source IP0' consists of transistors Q55, Q56 coupled together as a current mirror with an emitter area ratio of transistors Q56:Q55 being 2:1. With a current source IP0 supplying from 1 to 25 µA, the output of the current source IP0' would be from 2 to 50 µA.

Figure 7A:
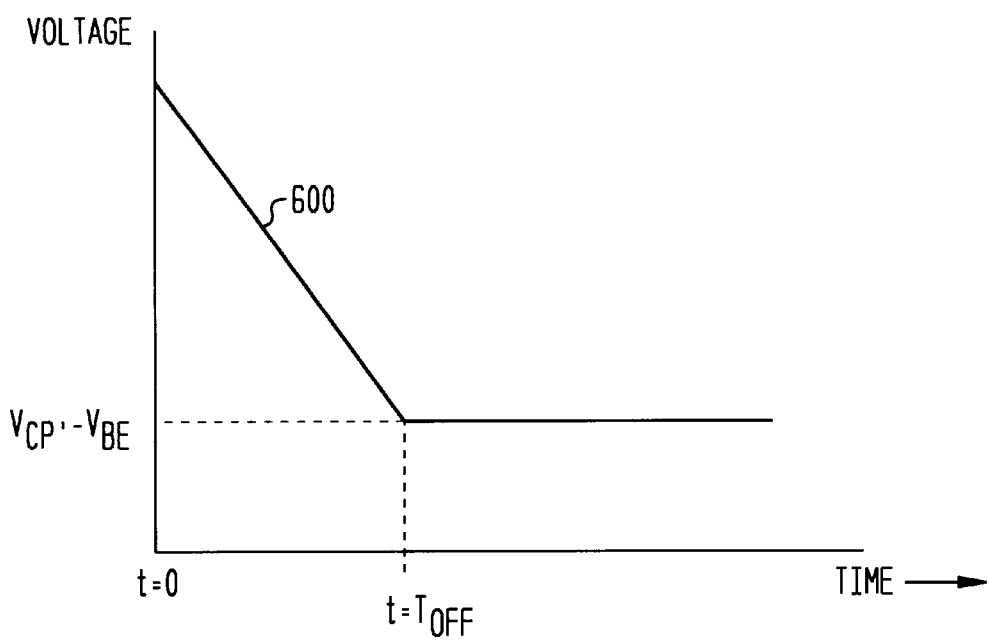
FIGS. 7A and 7B are graphs representing operation of the clamp circuit according to the present invention.
Figure 7B:
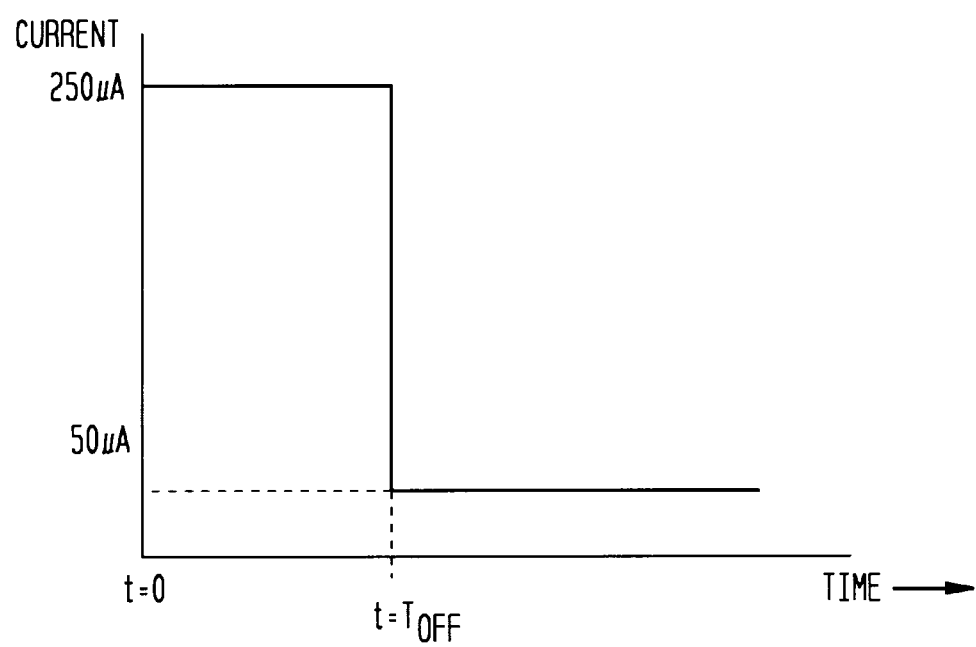

The operation of clamp circuit 402 also can be explained with reference to the graphs of FIGS. 7A and 7B. The voltage at node B is shown by line 600 in FIG. 7A. At time t=0, when the follower is disabled, the voltage at node B will drop to the level VCP'-$V_{BE}$ or, when the transistor Q50 is present in the clamp circuit, will drop to the level VCP'-$2*V_{BE}$. The voltage at node B then will stay at that level while the follower is off. As shown in FIG. 7B, the current used by the clamp will stay at a high level of 250 µA until the voltage at node B reaches its lowest level. At that point, t=$T_{off}$, the current consumed by the clamp will drop to a much lower level which, in the example above, is approximately 50 µA, and remain at this low level while the follower is turned off. As can be seen, high current is provided for fast switching time and then only low power is needed when the follower is turned off.

Figure 3:
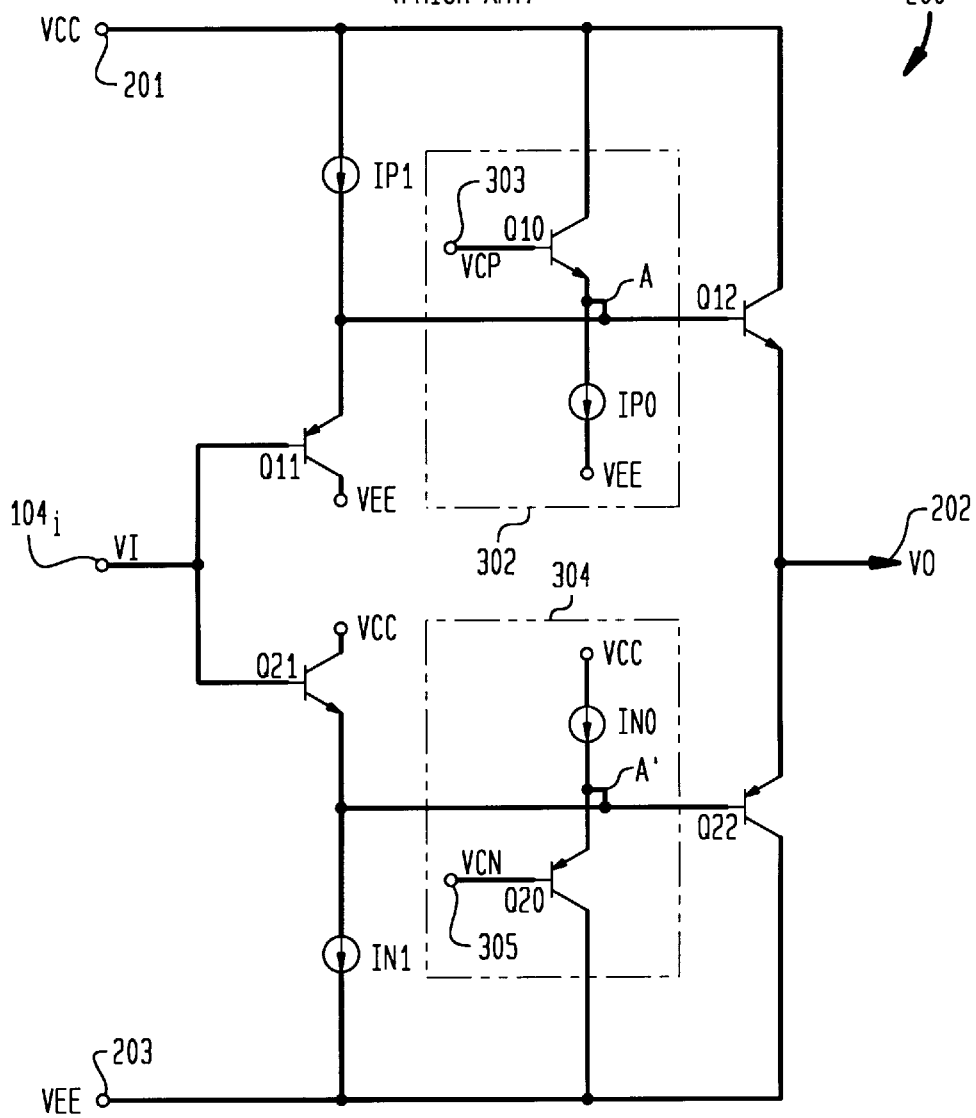
FIG. 3 is a schematic diagram of a conventional complementary emitter follower buffer with conventional clamp circuits.
Figure 4:
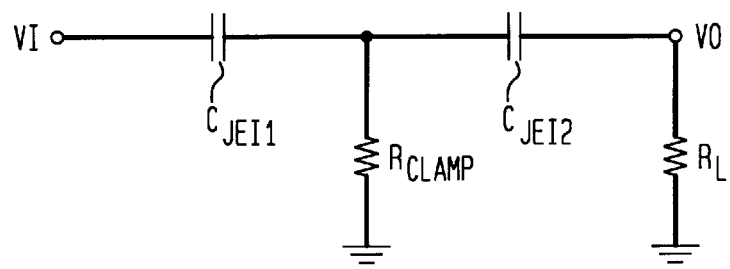
FIG. 4 is a small signal model of the conventional buffer shown in FIG. 3.

Compared to the output impedance $R_{CLAMPA}$ at node A of the clamp circuit 302 including transistor Q10 and current source IP0 of FIG. 3, the output impedance $R_{CLAMPB}$ at node B of clamp circuit 402 is lower. The output impedance $R_{CLAMPA}$ is equivalent to the impedance looking into the emitter of transistor Q10. As a result, the output impedance $R_{CLAMPA}$ is inversely proportional to current source IP0 and can be described as follows:

$$R_{CLAMPA} = R_{Q10} \propto \frac{1}{IP0} \quad (12)$$

so that a large current IP0 is necessary to obtain a low output impedance $R_{CLAMPA}$.

The present invention, while using a small current to clamp quickly, however, also provides a small value for $R_{CLAMPB}$. Looking back into the output of clamp circuit 402, FIG. 5, at node B, the output impedance $R_{CLAMPB}$ is proportional to voltage and current and appears as:

$$R_{CLAMPB} \propto \frac{\Delta V}{\Delta I} \quad (13)$$

This analysis is based on the observation that a change in the voltage at node B, i.e., $\Delta V$, results in a change in current represented by:

$$\Delta I = \Delta V / R_{CLAMPB} \quad (14)$$

However, due to the M:1 current mirror, the following relationship is also true:

$$\Delta I = (M+1)(\Delta V / R_{Q51}) \quad (15)$$

where $R_{Q51}$ is the resistance looking into the emitter of Q51 if its collector where just connected to $V_{CC}$.

$R_{CLAMPB}$ can then be described as follows:

$$R_{CLAMPB} = \frac{\Delta V}{\Delta I} = \frac{R_{Q51}}{M+1} \quad (16)$$

so the impedance is reduced as a function of the value M of the M:1 current mirror.

It should be understood that while the buffer of the present invention was shown and described as complementary, it alternatively could be a non-complementary circuit and both are considered to be within the scope of the invention. Similarly, while certain of the transistors were described as PNP and others as NPN, they were shown as exemplary and could be interchanged to suit a particular application. In addition, where particular values were used for resistors and currents, these were exemplary and do not limit the invention as defined by the attached claims. Finally, while the transistors were described as bi-polar, MOS transistors alternatively could be used within the scope of the invention to suit a particular application.

Having thus described at least one illustrative embodiment of the invention, various alterations, modifications and improvements will readily occur to those skilled in the art. Such alterations, modifications and improvements are intended to be within the spirit and scope of the invention. The invention is limited only as defined in the following claims and the equivalents thereto.

What is claimed is:

1. A clamp circuit for electrically isolating an output of an output transistor from an input of an input transistor, the clamp circuit comprising:

a bias voltage lead;

a first clamp transistor having a base, a collector and an emitter, the base connected to the bias voltage lead;

a second clamp transistor having an emitter connected to a node to which the output transistor and the input transistor are connected, a base connected to the base of the first clamp transistor and a collector connected to the emitter of the first clamp transistor; and a current mirror circuit having an input and an output, the input connected to the collector of the first clamp transistor and the output connected to the emitter of the second clamp transistor.

2. The clamp circuit as recited in claim 1, wherein the current mirror circuit comprises:

a first mirror transistor having a base and a collector connected to one another; and a second mirror transistor with a base connected to the base of the first mirror transistor, a collector connected to the emitter of the second clamp transistor and an emitter connected to an emitter of the first mirror transistor.

3. The clamp circuit as recited in claim 1, wherein the current mirror circuit comprises:

a first mirror transistor having a base and a collector connected to one another;

a second mirror transistor with a base connected to the base of the first mirror transistor; and a first mirror resistor having a first terminal connected to the emitter of the first mirror transistor and a second terminal connected to the emitter of the second mirror transistor.

4. The clamp circuit as recited in claim 1, further comprising a diode connected between the emitter of the second clamp transistor and the output of the current mirror circuit.

5. The clamp circuit as recited in claim 4, wherein the diode comprises a protection transistor having a base and a collector connected to one another, the collector connected to the emitter of the second clamp transistor and the emitter connected to the output of the current mirror circuit.

6. The clamp circuit as recited in claim 1, wherein the current mirror circuit comprises:

a first mirror transistor having a base and a collector connected to one another;

a first mirror resistor having first and second terminals, the first terminal connected to an emitter of the first mirror transistor;

a second mirror transistor with a base connected to the base of the first mirror transistor; and a second mirror resistor having first and second terminals, the first terminal connected to the emitter of the second mirror transistor and the second terminal connected to the second terminal of the first mirror resistor.

7. The clamp circuit as recited in claim 6, further comprising a current source connected to the emitter of the first clamp transistor.

8. The clamp circuit as recited in claim 7, wherein the current source comprises:

a third mirror transistor;

a fourth mirror transistor;

a second current source connected to the third mirror transistor wherein the third and fourth mirror transistors are connected to one another as a current mirror circuit.

9. A clamp circuit, comprising:

a first clamp transistor having a base, a collector and an emitter;

a first mirror transistor having a base and a collector connected to one another;

a second mirror transistor having a base connected to the base of the first mirror transistor; and a second clamp transistor having an emitter connected to a collector of the second mirror transistor, a base connected to the base of the first clamp transistor and a collector connected to the emitter of the first clamp transistor.

10. The clamp circuit as recited in claim 9, further comprising:

a first mirror resistor having first and second terminals, the first terminal connected to an emitter of the first mirror transistor; and a second mirror resistor having first and second terminals, the first terminal connected to the emitter of the second mirror transistor and the second terminal connected to the second terminal of the first mirror resistor.

11. The clamp circuit as recited in claim 9, further comprising a current source connected to the emitter of the first clamp transistor.

12. The clamp circuit as recited in claim 9, further comprising a bias reference line connected to the base of the first camp transistor.

13. A video signal multiplexer comprising:

an output transistor;

a first clamp transistor having a base, a collector and an emitter;

a second clamp transistor having an emitter connected to the output transistor, a base connected to the base of the first clamp transistor and a collector connected to the emitter of the first clamp transistor; and a current mirror circuit having an input and an output, the input connected to the collector of the first clamp transistor and the output connected to the emitter of the second clamp transistor.

14. The video signal multiplexer of claim 13, wherein the current mirror circuit comprises:

a first mirror transistor having a base and a collector connected to one another;

a second mirror transistor with a base connected to the base of the first mirror transistor; and a second clamp transistor having an emitter connected to the collector of the second mirror transistor, a base connected to the base of the first clamp transistor and a collector connected to the emitter of the first clamp transistor.

15. The video signal multiplexor of claim 14, wherein the current mirror circuit further comprises:

a first mirror resistor having first and second terminals, the first terminal connected to an emitter of the first mirror transistor; and a second mirror resistor having first and second terminals, the first terminal connected to the emitter of the second mirror transistor and the second terminal connected to the second terminal of the second mirror resistor.

16. A clamp circuit for use in a switched complementary emitter follower including an input terminal connected to a base of a first transistor, a first current source connected between an emitter of the first transistor and a first supply line, a collector of the first transistor connected to a second supply line, an output transistor having a base to the emitter of the first transistor, an emitter of the output transistor connected to an output terminal, a collector of the output transistor connected to the first supply line the clamp circuit being connected to the base of the output transistor, comprising:

a clamp reference terminal;

a first clamp transistor having a base connected to the clamp reference terminal;

a first mirror transistor having a base connected to its collector;

a first mirror resistor having first and second terminals, the first terminal connected to an emitter of the first mirror transistor and the second terminal connected to the second supply line;

a second mirror transistor with a base connected to the base of the first mirror transistor and a collector connected to the base of the output transistor;

a second mirror resistor having first and second terminals, the first terminal connected to the emitter of the second mirror transistor and the second terminal connected to the second supply line;

a second clamp transistor having an emitter connected to the collector of the second mirror transistor, a base connected to the base of the first clamp transistor and a collector connected to the emitter of the first clamp transistor; and a second current source connected between the first supply line and the emitter of the first clamp transistor.

17. The emitter follower as recited in claim 16, wherein the clamp circuit further comprises a diode connected between the emitter of the second clamp transistor and the collector of the second mirror transistor.

18. The emitter follower as recited in claim 17, wherein the diode comprises a transistor having a base and a collector connected to one another, the collector connected to the emitter of the second clamp transistor and the emitter connected to the collector of the second mirror transistor.

19. A method of clamping a node to a predetermined voltage level, an output of an input transistor and an input of an output transistor, each transistor being connected to the node, the method comprising the steps of:

providing a current to the node at a first current level until a voltage at the node reaches the predetermined voltage level; and providing the current to the node at a second current level when the voltage at the node has reached the predetermined voltage level.

20. The method as recited in claim 19, further comprising a step of:

providing a low impedance at the node after the node has reached the predetermined voltage level.

21. A clamp circuit for electrically isolating an output of an output transistor from an input of an input transistor, the clamp circuit comprising:

a bias voltage lead;

a first clamp transistor of a first type having a base, a first terminal and a second terminal, the base connected to the bias voltage lead;

a second clamp transistor of a second type, different from the first type, having a base connected to the base of the first clamp transistor, a first terminal connected to the second terminal of the first clamp transistor and a second terminal connected to a node to which the output transistor and the input transistor are connected; and a current mirror circuit having an input and an output, the input connected to the first terminal of the first clamp transistor and the output connected to the second terminal of the second clamp transistor.

22. The clamp circuit as recited in claim 21, wherein the current mirror circuit comprises:

a first mirror transistor having a base and a first terminal connected to one another; and a second mirror transistor with a base connected to the base of the first mirror transistor and a second terminal connected to the second terminal of the second clamp transistor.

23. The clamp circuit as recited in claim 22, wherein the current mirror circuit further comprises:

a first mirror resistor having first and second terminals, the first terminal connected to the second terminal of the first mirror transistor; and a second mirror resistor having first and second terminals, the first terminal of the second mirror resistor connected to the second terminal of the second mirror transistor and the second terminal of the second mirror resistor connected to the second terminal of the first mirror resistor.

* * * * *